(12) United States Patent
Yoshitake et al.

(10) Patent No.: US 6,281,024 B1
(45) Date of Patent: Aug. 28, 2001

(54) SEMICONDUCTOR DEVICE INSPECTION AND ANALYSIS METHOD AND ITS APPARATUS AND A METHOD FOR MANUFACTURING A SEMICONDUCTOR DEVICE

(75) Inventors: Yasuhiro Yoshitake, Yokosuka; Kenji Watanabe, Oume; Yoshimasa Fukushima, Hitachinaka; Minori Noguchi, Yokohama, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/322,149

(22) Filed: May 28, 1999

(30) Foreign Application Priority Data

May 29, 1998 (JP) .................................................. 10-148708

(51) Int. Cl.[7] .................................................. H01L 21/00
(52) U.S. Cl. .................................. 438/8; 438/16; 438/14; 438/5; 257/48; 356/237; 430/5
(58) Field of Search .................................. 438/8, 16–18, 438/14, 5; 257/48; 356/237; 430/5

(56) References Cited

U.S. PATENT DOCUMENTS 5,233,191 * 8/1993 Noguchi et al. ..................... 250/306
5,903,342 * 5/1999 Yatsugake et al. ................ 356/237.4
5,909,276 * 6/1999 Kinney et al. ....................... 356/237

OTHER PUBLICATIONS

R. Knollenberg, "Polarization diversity surface analysis system" Lasers in Microlithography SPIE vol. 774 p. 32–40 1987.*

* cited by examiner

Primary Examiner—Matthew Smith
Assistant Examiner—G. Lee, Jr.
(74) Attorney, Agent, or Firm—Antonelli, Terry, Stout & Kraus, LLP

(57) ABSTRACT

A method and system for inspecting and/or analyzing semiconductor devices in which particles in a semiconductor wafer which is processed in a semiconductor device manufacturing line are detected. A particle is selected from among the detected particles and the selected particle is etched to expose a cross section of the selected particle. The selected particle whose cross section is exposed has the element thereof analyzed, and after analyzation, the semiconductor wafer is continued to be processed in the semiconductor device manufacturing line. For etching, pattern data having an edge which intersects the selected particle is created and the semiconductor wafer which is coated with a photosensitive material is exposed by a light pattern according to the pattern data so that an edge intersects the selected particle. Thereafter, the etching is carried out to expose the cross section of the selected particle and analyzation is effected.

10 Claims, 6 Drawing Sheets

| PARTICLE NO. | CHIP POSITION | COORDINATES IN CHIP | SIZE | ANALYSIS FLAG |
|---|---|---|---|---|
| 1 | 2.3 | 2.46, 3.57 | 2.12 | 1 |
| 2 | 3.5 | 3.19, 0.29 | 1.56 | 0 |
| 3 | 5.4 | 4.23, 1.17 | 1.12 | 0 |
| . | . | . | . | . |
| . | . | . | . | . |
| . | . | . | . | . |

SEMICONDUCTOR DEVICE INSPECTION AND ANALYSIS METHOD AND ITS APPARATUS AND A METHOD FOR MANUFACTURING A SEMICONDUCTOR DEVICE

BACKGROUND OF THE INVENTION

1. Field of the Invention

The present invention relates to a semiconductor device inspection and analysis method and its apparatus including particles detected therein, as well as a method for manufacturing a semiconductor device, more particularly to an effective technique for analyzing particles detected by particle inspecting equipment efficiently in semiconductor device manufacturing processes.

2. Description of the Related Art

In semiconductor device manufacturing processes, it is indispensable to find causes of defects earlier and feed back the results to the object processes and manufacturing system so as to keep and improve the expected production yield. And, to realize such the object, it is also important to find defects and analyze the inspection data using inspecting equipment.

Generally, a method for manufacturing semiconductor devices comprises a filming process for filming the substrate of each semiconductor device, a photo-process for printing circuit patterns on the semiconductor device, and an etching process for etching the films of the semiconductor device. Such semiconductor devices are manufactured by repeating those processes cyclically. In recent years, the photo-process has been changed especially so that a light for exposing patterns is being replaced with an electron beam so as to enable micro fabrication of not more than 0.2 $\mu$m, as well as obtain a deeper depth of focus. In a particle check is also carried out an inspection process after the filming process is finished. This particle inspection is carried out automatically by the inspecting equipment that uses a night-vision laser light.

The inspecting equipment outputs coordinate data of each particle detected in the object semiconductor wafer to an inspection data base. After this, the inspecting equipment moves the inspected wafer onto the stage of a metal microscope or a scanning electron microscope, then moves the stage to the position corresponding to the coordinate data of the detected particle, thereby classifying the particle using the expanded image thereof. This classification work is referred to as a reviewing process. If many particles are detected under a film at this time and it cannot be judged why they are generated, the inspecting equipment selects some of those particles and analyzes the element of each of the selected particles.

The element of each particle detected under a film is analyzed as follows.

At first, the film formed on the object particle is removed, thereby exposing the object particle. Then, the cross section thereof is treated using FIB (Focused Ion Beam) equipment. The wafer containing the particle is moved onto the stage of the FIB equipment, then the stage is moved to a position corresponding to the coordinate data of the particle. After this, the film is trimmed using the FIB equipment, thereby exposing the particle. At this time, the amount and position of the FIB application are adjusted manually while a visual check is made for the detected image displayed on the FIB screen to decide whether or not the particle should be exposed.

The wafer is then moved into an element analyzer, which analyzes the element of the particle. The element analyzer is, for example, EDX (Energy Dispersive X ray) equipment, which applies an electron beam to the object particle and detects the X ray generated from the particle, thereby identifying the element thereof from its energy vector. In addition, the element analyzing is, for example, AES (Auger Electron Spectroscopy) equipment, which analyzes the element of the object particle from its energy spectrum by detecting the auger electron instead of the X ray.

The element of the object particle is identified using of such an element analyzer, thereby reasoning the cause for generating the particle by analogy so as to facilitate the semiconductor manufacturing process and system to take proper countermeasures.

The inventor of the present invention has found, however, that the element analysis of particles detected under a film as described above includes the following problems.

Concretely, since the FIB equipment is operated manually, it takes about one hour for the cross section treatment of an object particle. In addition, since the FIB equipment uses gallium ions for the beam and the gallium pollutes even normal chips including no particle after the cross section treatment, the wafer used for element analysis cannot be transferred to the next process. In other words, the wafer must be disposed after the analysis.

SUMMARY OF THE INVENTION

Under such the circumstances, it is an object of the present invention to provide a method for the cross section treatment of each particle detected film without degrading the through-put of the semiconductor device manufacturing process and without polluting any normal chips during the treatment.

The first-time features of the present invention will appear more fully from the description and accompanying drawings of this specification.

In order to achieve the above object, the present invention composes a semiconductor device inspecting/analyzing system so as to be provided with particle detecting means for detecting particles in a semiconductor wafer treated as predetermined by a semiconductor device manufacturing line; reviewing means for displaying each of particles detected by the particle detecting means so as to measure both position and size thereof, light-exposing means for exposing a predetermined pattern to a light on the semiconductor wafer coated with a photosensitive material thereon according to the position and size of the object particle measured by the reviewing means so that its edge comes on the particle; etching means for etching the semiconductor wafer exposed to a light by the light-exposing means, thereby exposing the cross section of the particle; and analyzing means for analyzing the element of the particle whose cross section is exposed by the etching means; and data processing means for exchanging data with the particle detecting means, the reviewing means, and the analyzing means, thereby processing the data.

Receiving the data of a particle detected by the detecting means and passed to the data processing means, the reviewing means displays the particle on a screen.

The light-exposing means creates predetermined pattern data according to the position and size of the particle measured by the reviewing means and passed to the data processing means so that its edge comes on the object particle, then exposes a pattern to a light on the object semiconductor device in accordance with this pattern data.

The light-exposing means is an electron beam equipment.

The data processing means exchanges data with an electric tester.

In order to achieve the above object, the semiconductor device inspecting/analyzing method of the present invention detects particles in a semiconductor wafer treated as predetermined by a semiconductor device manufacturing line, displays a particle selected from among detected particles, measures both position and size of the displayed particle, exposes a predetermined pattern to a light on the semiconductor wafer coated with a photosensitive material thereon according to the position and size of the measured particle so that its edge comes on the particle, etches the light-exposed semiconductor wafer, thereby exposing the cross section of the particle and analyzing the element of the particle whose cross section is exposed.

The present invention is characterized by that the particle selected from detected ones so as to be displayed on a screen is a particle stuck on the semiconductor wafer after a predetermined process, which has eliminated all other particles from the semiconductor wafer.

The present invention is also characterized by that a predetermined pattern is exposed to a light on the object semiconductor device so that its edge comes on the particle according to a predetermined pattern created according to the position and size of the measured particle.

The present invention is also characterized by that an electron beam is used for exposing the above pattern.

The present invention is also characterized by a semiconductor manufacturing method, wherein particles are detected in a semiconductor device treated as predetermined by a semiconductor device manufacturing line, then one of those detected particles is selected so as to expose its cross section and analyze the element thereof, then return the semiconductor wafer including the element-analyzed particle to the semiconductor device manufacturing line so as to be treated properly in and after the predetermined processes.

DESCRIPTION OF THE PREFERRED EMBODIMENTS

Figure 1:
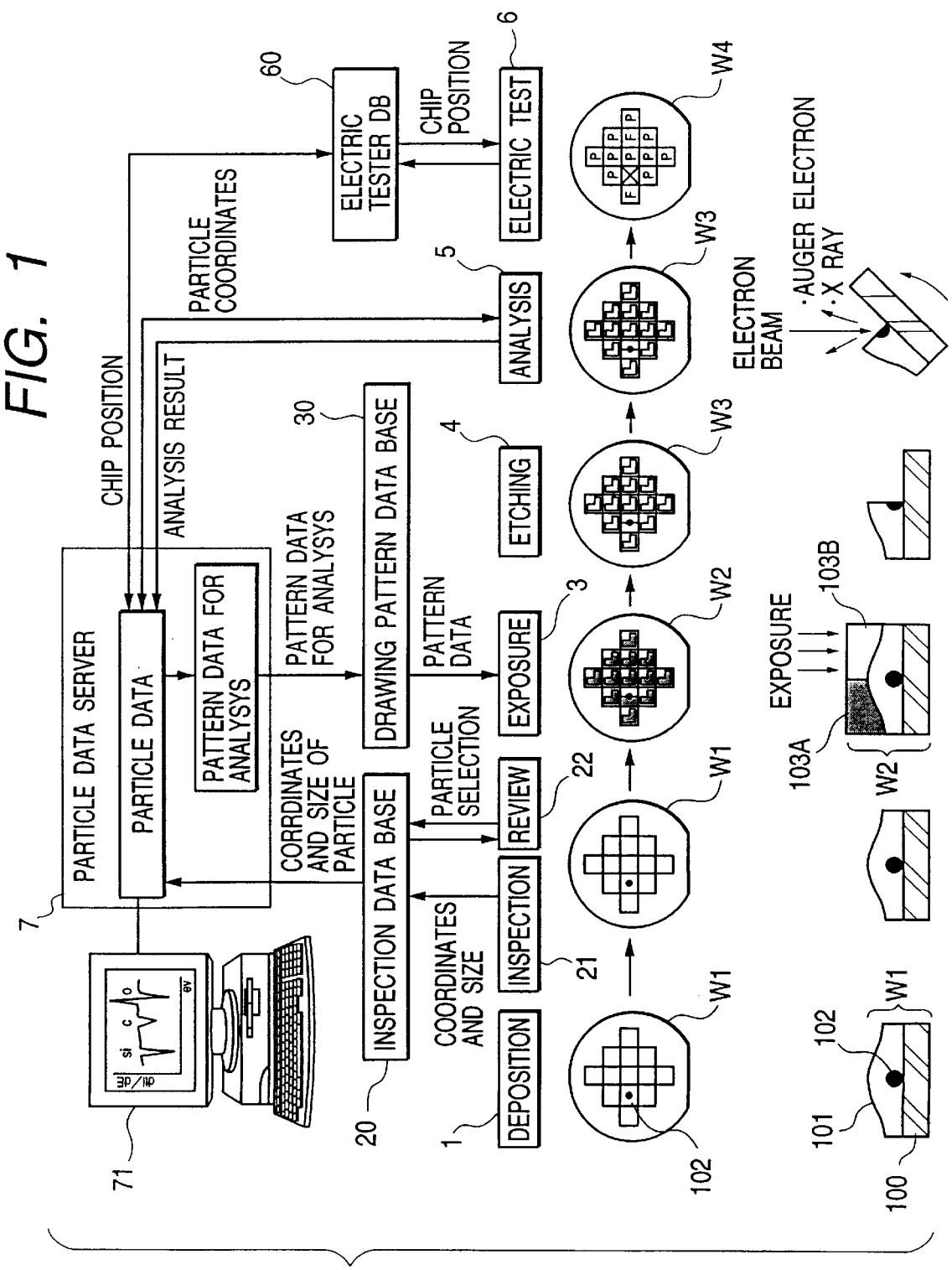
FIG. 1 is a block diagram of a semiconductor manufacturing system in an embodiment of the present invention.

The semiconductor device inspecting/analyzing system of the present invention comprises inspecting means for inspecting particles detected in a semiconductor device; particle selecting means for selecting an object particle to analyze; pattern data creating means for creating pattern data for treating the cross section of the selected particle from the coordinate and size data thereof and passing the pattern data to light-exposing equipment; light-exposing means for exposing a predetermined pattern on the semiconductor wafer according to the pattern data; etching means for etching the semiconductor wafer using the light-exposure pattern as a mask; and analyzing means for analyzing the element of the cross section of the exposed particle through etching.

Consequently, it is no need to add any special treatment for the cross section treatment of the object particle to the object semiconductor device manufacturing processes, thereby the cross section treatment of the particle is finished just when the object normal circuit pattern is created. In addition, since the treatment is the same as that in normal semiconductor device manufacturing processes, normal chips are free of pollution during the treatments. Each wafer, after the element of the particle detected therein is analyzed, is returned to the semiconductor device manufacturing line and transferred to the next process. Consequently, other chips than the object chip to analyze can be completed as non-defective ones.

The particle selecting means is provided with the first storing means for storing particle inspection data; the first arithmetic means for comparing the coordinate data of particles detected in the manufacturing processes of the previous semiconductor device detected by the particle inspecting equipment, that is, detected after the previous filming process with the coordinate data of particles detected after the current filming process, then deleting the matching coordinate data of the particles detected in the previous process from the coordinate data of the particles in the current process; reviewing equipment for displaying an expanded image of a selected particle according to the coordinate data thereof after the deletion, thereby judging the analysis result, and measuring both coordinate data and size of the particle again so as to obtain more accurate data; and second storing means for storing the analysis result data.

Consequently, the particles generated in the manufacturing processes of the preceding semiconductor device can be deleted when an object particle to analyze is selected by the reviewing equipment, thereby the particle selection efficiency is improved more. In addition, since highly accurate particle data is obtained such way, the pattern data creating means can create accurate pattern data so as to be used for treating the cross section of the object particle.

The pattern data creating means of the light-exposing equipment is provided with third storing means for storing object particle data transferred from the second storing means; second arithmetic means for computing the pattern data of a chip to analyze from the coordinate data and size of the particle stored in the third storing means; and fourth storing means for storing the pattern data of the object chip to analyze.

It is thus possible to create the pattern data of the object chip to analyze automatically from the coordinate data and size of the object particle.

In addition, the pattern data creating means is provided with the first communication controller for transmitting object particle data stored in the third storing means; the fifth storing means for storing the analysis result of the analyzing means; and display equipment for displaying the analysis result.

It is thus possible to locate a particle in the analyzing means and check the analysis result effectively.

The pattern data creating means is provided with the second communication controller for transmitting the positional information of a chip to analyze according to the particle data stored in the third storing means to an electric tester used to test whether the object semiconductor is defective or non-defective.

It is thus possible for the electric tester to omit testing of the object chips to analyze. It is also possible to display the position of the chip to analyze on a test result map, thereby indicating that the chip is excluded from an OK/NG judgment.

Hereunder, the method and the system for inspecting and analyzing semiconductor devices, as well as the configuration and functions of the system will be described with reference to FIG. 1.

At first, deposition equipment 1 forms a film 101 such as a gate layer, a wiring layer, an insulator layer, etc. on a wafer substrate 100. At this time, a particle 102 is generated between the wafer substrate 100 and the film 101. The film-coated wafer W1 is then inspected by inspecting equipment, then the coordinates and size of the detected particle 102 is transmitted to an inspection data base. Reviewing equipment 22 receives the coordinate data of the detected particle 102 from the inspection data base 20 and moves the film-coated wafer W1 to the position of the detected particle. An expanded image of the detected particle is observed with a light or an electron beam so as to judge whether to analyze the detected particle 102. The reviewing equipment measures both coordinates and size of the detected particle 102 again to obtain more accurate data by processing the expanded image. When it is judged that the particle should be analyzed, the reviewing equipment sets an analysis flag, which indicates "analysis needed", in the data of the detected particle 102 and transmits the flag-written data to the inspecting data base 20. The particle selecting means comprising the inspection data base 20 and the reviewing equipment 22 will be described later with respect to FIG. 2.

If the detected particle 102 is selected as an analysis object, the accurate coordinates and size of the particle 102 are transmitted to the analyzing particle server 7, which creates pattern data. The particle server 7 creates pattern data used for analyzing and treating the particle in the light-exposing equipment from the accurate coordinate data and the accurate size data of the particle 102. Then, the server 7 transmits the pattern data to the pattern data base 30. How to create such pattern data will be described later with reference to FIG. 3.

Receiving pattern data from the pattern data base 30, the light-exposing equipment 3 exposes the wafer W2 coated with a photo-resist 103 to a light on the wafer W1 after deposition. The photo-resist 103, when exposed to the light, forms a boundary or an edge which intersects the particle 102. Developing equipment (not illustrated) then removes the light-exposed photo-resist 103B. Although a positive type photo-resist is used in this treatment, a negative photo-resist may also be employed. If such a negative one is used, the non-exposed portion 103A is removed.

After this, the etching equipment 4 etches the no-photo-resisted portion (the photo-resist portion 103B), thereby completing an etched wafer W3 including etching of a portion of the particle 102 so as to expose a cross section thereof. After this etching, asher equipment (not illustrated) removes the photo-resist left over after the etching.

The analyzing equipment 5 receives the coordinate data of the particle 102 from the particle server 7 and moves the etched wafer W3 to the position of the particle 102. The analyzing equipment 5 tilts the wafer W3, applies such a beam as an electron beam to the exposed cross section of the particle 102, thereby analyzing the auger electron or X ray using the AES, EDX, or the like. The result of the element analysis of the particle 102 is transmitted to the particle server 7. The analysis result displaying equipment 71 receives the spectrum, as well as such information as coordinate data, size, etc. of the particle, which are all results of the element analysis performed using an AES, EDX, or the like from the particle server 7 so as to display those data items.

Such wafer treatments are also repeated in the next semiconductor process using the filming equipment 1, the inspecting equipment 21, the reviewing equipment 22, a light-exposing equipment 3, the etching equipment 4, and the analyzing equipment 5.

After all the processes of the object semiconductor wafer are finished, the electric tester 6 performs an electric test for each chip of the completed wafer W4. At this time, the electric tester 6 obtains the position data of each chip from the particle server 7 via the electric tester data base. The electric tester 6 excludes the chip including the particle 102 from the testing and writes a symbol indicating that the chip has been excluded from the testing into the electric tester data base. The symbol is, for example, an "X". This symbol writing enables the electric tester 6 to exclude the chip from the testing, and furthermore, to display the position of the chip onto a test result map, so that the chip is excluded from an OK/NG judgment.

Since the particle server 7 receives information from the electric tester 6 via the electric tester data base 60, the particle data and the electric testing information can be used to process the inspection/analysis data.

This will complete the description of the configuration and functions of the semiconductor device manufacturing system of the present invention.

Next, description will be made for how a particle is selected in both reviewing equipment 22 and inspection data base 20 for analyzing with reference to FIGS. 2 and 3.

Assume now that particles detected after the film 101 is formed are referred to as particles in the current process. The inspecting equipment 21, after a particle inspection is finished, transmits the coordinate data of the particles detected in the current process to the inspection data base 20.

The coordinate data of the particles in the current process is then stored in the particle data storing means 210 via the communication controller 201 of the inspection data base 20, the data I/O device 202, and the I/O interface 203.

The inspecting equipment 21 also detects particles generated in the processes preceding the filming process of the film 101. The particles in the current process also include those detected in the preceding processes. In the present invention, a normal semiconductor device manufacturing process etches the film 101 formed on the object particle. A particle detected in or under a film formed under the film 101 therefore cannot be removed, since the film cannot be removed. This is why the following method is employed to extract particles generated in the filming process of the film 101.

Coordinate data of the particles detected in the preceding processes is registered in the particle data storing means 210. The main controller 204 reads the coordinate data of each of those particles detected in the current process from the particle data storing means 210 and the coordinate data of each particle in the preceding processes via the I/O interface 203 and the data I/O device 202. The main controller 204 then starts up the arithmetic device 206 so as to compute data as follows. This arithmetic operation method will be described with reference to FIG. 3.

The arithmetic device 206 compares the coordinate data Z1 of particles in the current process with the coordinate data Z2 of particles in the previous process. The arithmetic device 206 regards the particles existing within a closer distance of the object coordinate data as matching particles, thereby subtracting the coordinate data Z2 from the coordinate data Z1 and outputs the result as the coordinate data Z3 of the net particles in the current process. Basically, the coordinate data Z3 of those net particles in the current process indicates only the particles detected newly in the current process. Consequently, the coordinate data of particles existing in layers formed under the film 101 in the current process are already deleted. The net particles in the current process thus indicate candidate particles whose cross sections can be treated for trimming through the etching in the current process. The main controller 204 writes the coordinate data Z3 of those net particles in the current process into the current process net particle storing means 220. Since a particle to analyze is selected from the net particles in this current process, the object narrowing efficiency is improved more than when all the particles in the current process are analyzed.

The reviewing equipment 22 receives the coordinate data of the net particles in the current process from the current process net particle storing means 220 via the I/O interface 203, the data I/O device 202, and the communication controller 201, thereby moving the film-formed wafer W1 to the position of the object current process net particle. The operator can select an object particle in the reviewing process from those existing under the current process film 101 by observing the expanded image thereof using a light or electron beam. At this time, the operator sets an "analysis needed" flag in the coordinate data of the selected particle. The flag value will be, for example, "1". The operator then transmits the flag-written data to the reviewing equipment 22. Generally, the "analysis needed" flag may be replaced with a classification number used in the reviewing operation.

The reviewing equipment 22 measures the coordinates and size of the particle accurately from the expanded image of the particle 102.

Figure 4:
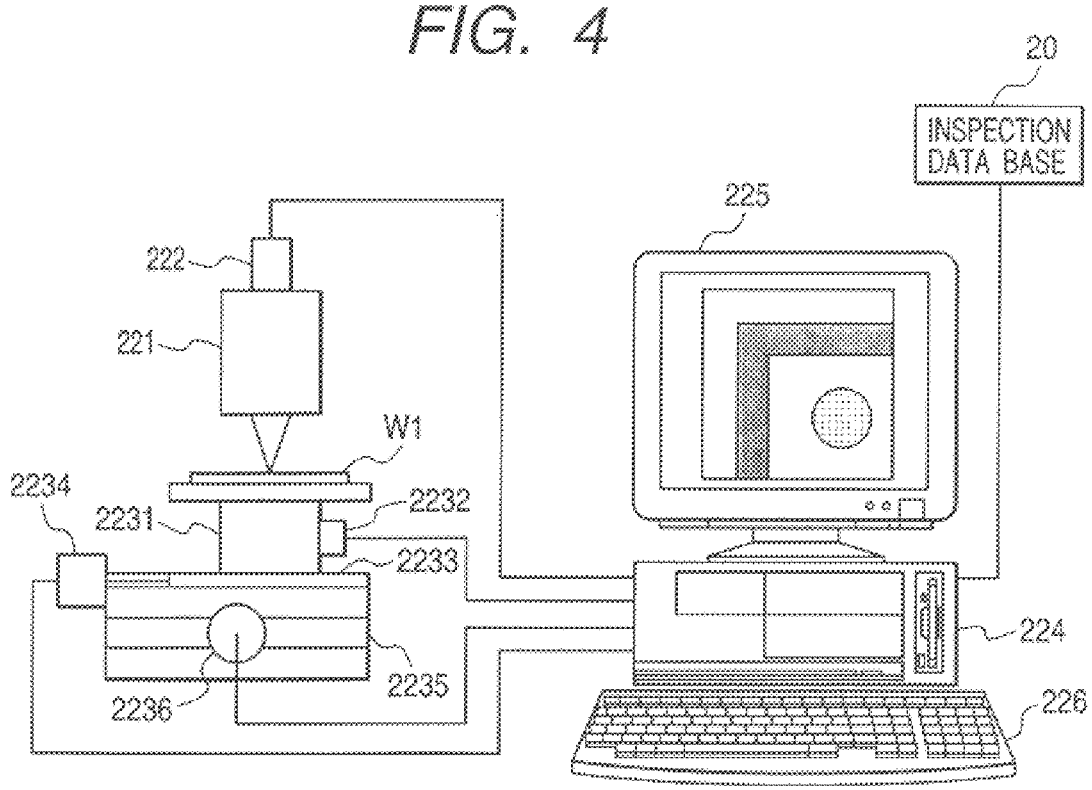
FIG. 4 is a schematic front view of reviewing equipment in an embodiment of the present invention.
Figure 5:
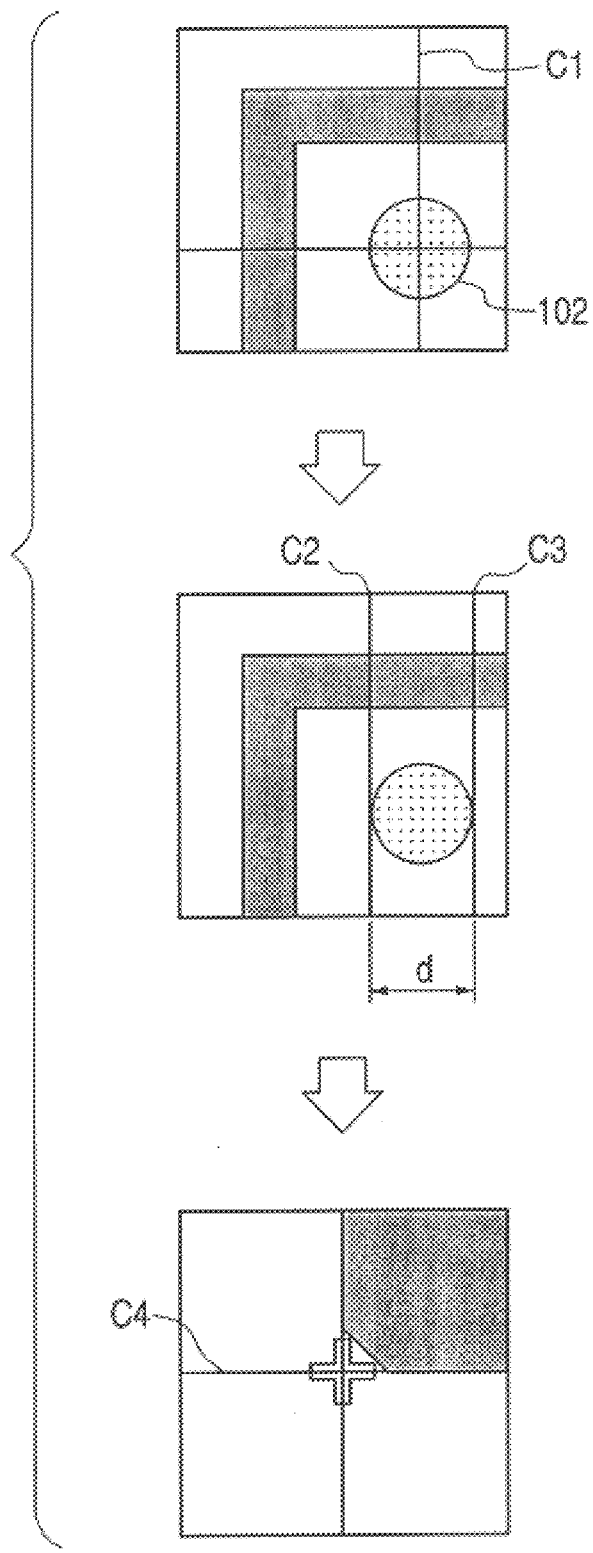
FIG. 5 is a front view of a display screen of the reviewing equipment in an embodiment of the present invention.

Hereunder, description will be made for how such an accurate measurement is done for the coordinates and size of a particle in the reviewing equipment 22 with reference to FIGS. 4 and 5. FIG. 4 shows a configuration of the reviewing equipment 22. A film-formed wafer W1 is mounted on a Z stage 2231 and a review equipment controller 224 drives both X and Y stage drivers 2234 and 2235 according to the coordinate data of the object particle obtained from the inspection data base 20, thereby moving both X and Y stages 2234 and 2235 to the position of the particle 102. Then, the microscope equipment 221 drives a Z stage driver 2232 so as to focus the expanded image of the particle 102 photographed by a photographing device 222 and move up/down the Z stage.

The operator then measures both coordinates and size of the particle 102 again accurately using, for example, the following method while observing the expanded image thereof displayed on the displaying equipment 225. This method will be described below in detail with reference to FIG. 5. A cross cursor C1 is displayed on the display screen 225. The operator can move the center of the cross cursor C1 onto the portion of the particle 102 for treating the cross section thereof by operating the keyboard 226 or the mouse. At this time, the reviewing equipment controller obtains the coordinate data (Xs, Ys) of the particle 102 with respect to the origins of the X and Y stages 2233 and 2235 from the calculation of the following expression according to the position data (Xi, Yi) of the center of the cross cursor and the coordinate data (Xw, Yw) of both X and Y stages 2233 and 2235.

$$Xs=Xi+Xs \quad Ys=Yi+Ys \hspace{2cm} \text{(Expression 1)}$$

The operator then displays the size measuring cursors C2 and C3 by operating the keyboard 226 and moves those cursors C2 and C3 to the edge of the particle 102. At this time, the reviewing controller 224 measures the size of the particle 102 from the distances of the cursors C2 and C3.

Finally, both X and Y stages 2233 and 2235 are moved according to the commands issued from the keyboard 226 so that the origin of the chip including the particle 102 is aligned to the center cursor C4 displayed in the center of the screen 225. This alignment is done when is the center of the origin chip mark 1020 is aligned to the cross portion of the center cursor C4 by operating the keyboard 226. At this time, the reviewing equipment controller 224 reads the coordinate data (X0, Y0) of both X and Y stages 2233 and 2235.

The reviewing equipment controller 224 computes the accurate coordinate data (Xc, Yc) of the particle 102 with respect to the origin chip mark 1020 from the calculation of the following expression (expression 2).

$$Xc=Xs-X0 \quad Yc=Ys+Y0 \hspace{2cm} \text{(Expression 2)}$$

The above operation can thus obtain accurate coordinate data and size of the object particle. And it is apparent that a well-known technique can automate this work through image processings, etc.

Figures 6, 7:
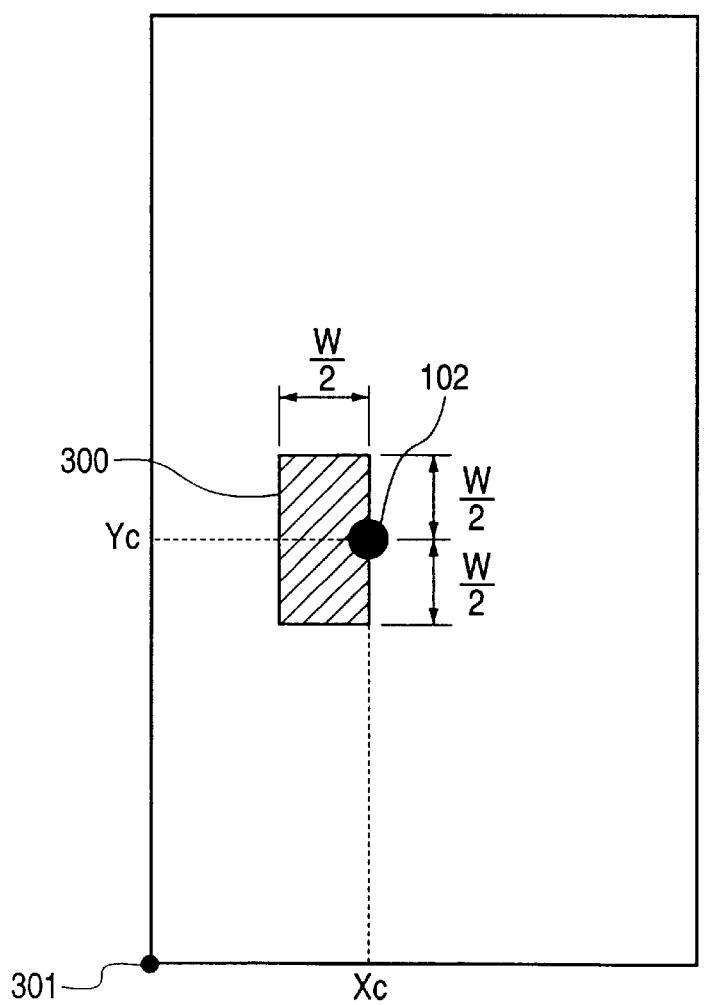
FIG. 6 shows an example of the data of net particles in the present process in an embodiment of the present invention.
FIG. 7 is a top view of a chip on which a mask for treating the cross section of a particle is projected in an embodiment of the present invention.

When treatment of all the net particles in the current process is finished, the "analysis needed" flag, the accurate particle coordinate data, and the accurate size data are transmitted to the inspection data base 20. Those data items are overwritten in the current process net particle storing means 220 via the communication controller 201, the data I/O device, the I/O interface 203. FIG. 6 shows an example of such data items. As shown in FIG. 6, the chip position, the coordinate data in the chip, the size, and the analysis flag are written for each particle number.

An object particle can thus be selected efficiently using a function as described above, and highly accurate coordinate data can be obtained for each particle so as to create pattern data for an accurate cross section treatment thereof.

The main controller 204 transmits the chip position of the particle for which 1 is set in the analysis flag, the coordinates of the particle in the chip, the size of the particle, and the analysis flag data selected from the data written in the current process net particle storing means 220 newly by the reviewing equipment 22 to the particle server 7 so as to be written in the particle data storing means 710 via the communication controller 701, the data I/O device 702, and the I/O interface 703.

Hereunder, description will be made for how to create pattern data for the cross section treatment of an object particle. The main controller 704 of the particle server 7 reads particle data from the particle data storing means 710 via the I/O interface 703 and the data I/O device 702 and stores the data in a memory 705. The main controller 704 then starts up the arithmetic device 706 for executing the following arithmetic operation. This operation will be described with reference to FIG. 7.

Assume now that the size of the object particle 102 is d, the length of the side of the pattern mask 300 is W in the X direction and W/2 in the X direction. Then, the W value is decided according to the result of calculation of the following expression (expression 3).

$$W = \alpha d \qquad \text{(Expression 3)}$$

In the above expression, the α is a coefficient. For example, if α=4 is assumed, W=8 μm is taken for the particle size d=2 μm. The position of the pattern mask 300 is set so that one side in the Y direction can pass the coordinates (Xc, Yc) of the particle 102 from the origin of the chip 301. However, even when the pattern mask 300 crosses the center of the particle 102 at a side in the X direction or when the pattern mask 300 is assumed as a rectangle, which is longer in the X direction, no problem will arise.

The arithmetic device 705 computes the data of the pattern mask 300 as described above.

The main controller 704 stores the data of the pattern mask 300 in the pattern data storing means 720 together with the data of the chip position via the data I/O device 702 and the I/O interface 703. The main controller 704 also transmits the data to the pattern data base 30 via the communication controller 701, so that the pattern data corresponding to the object chip is corrected to the data of the pattern mask 300.

Figure 2:
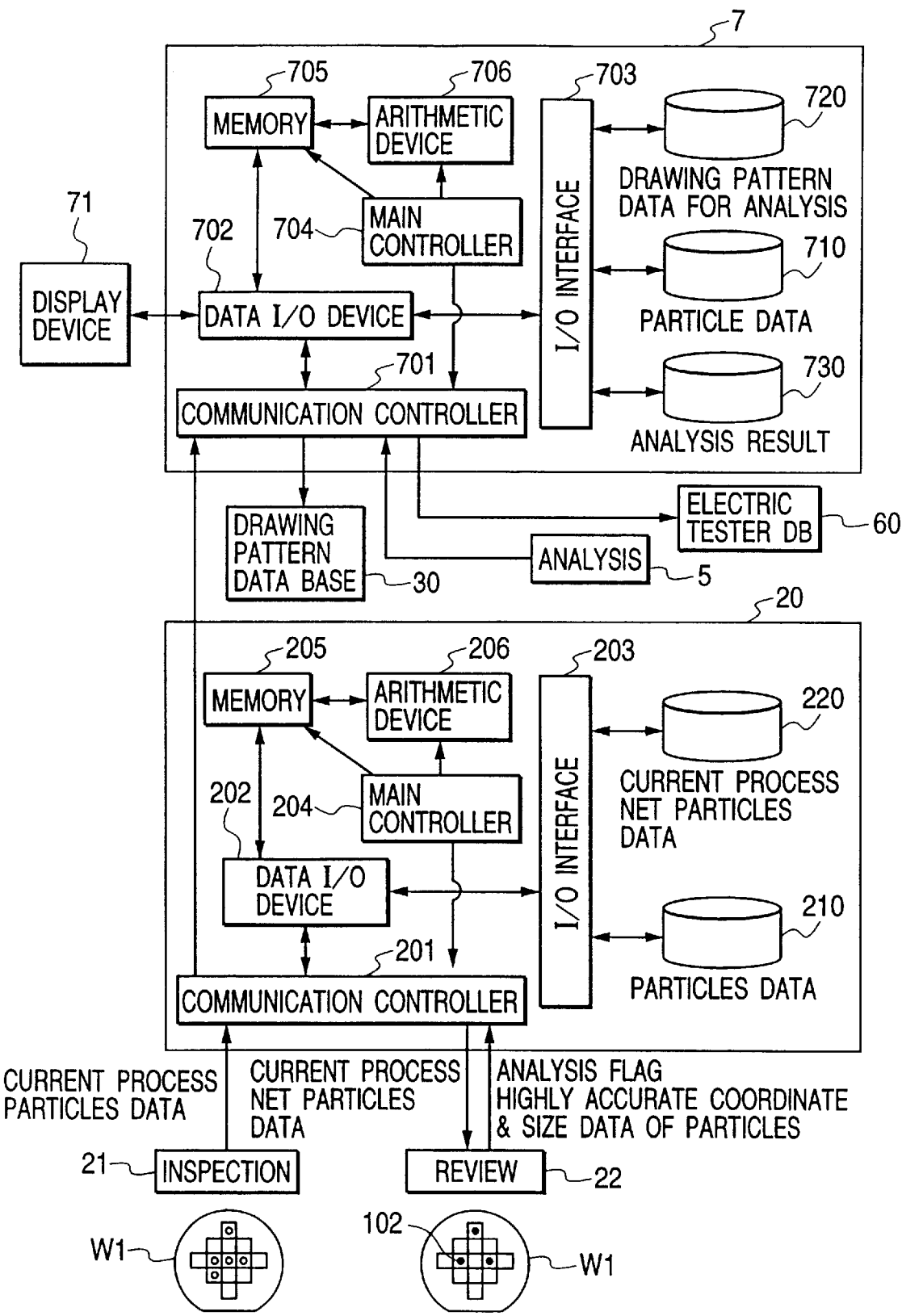
FIG. 2 is a block diagram explaining an inspection data base and a particle server in an embodiment of the present invention.
Figure 3:
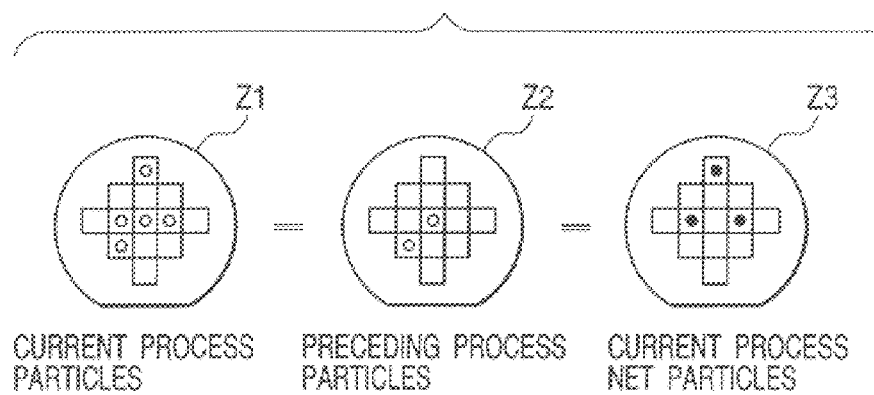
FIG. 3 shows top views of a semiconductor wafer, indicating how to compute data of net particles in the present process in an embodiment of the present invention.

In FIG. 2, the analyzing equipment 5 reads such particle data as coordinates, etc. from the particle data storing means 701 via the communication controller 701, the data I/O device 702, the I/O interface 703. In the same way, the analyzing equipment 5 stores such analysis result data as auger electron energy, energy spectrum chart, etc. in the analysis result storing means 730. The particle storing means 710 and the analysis result storing means 730 may be the same storing means used commonly.

The main controller 704 reads the chip position data from the particle storing means 710 to the electric tester data base 60 via the I/O interface 703, the data I/O device 702, and the communication controller 701.

Hereunder, description will be made for the functions of the light-exposing equipment 3 used for the cross section treatment of each particle with reference to FIG. 8.

Figure 8:
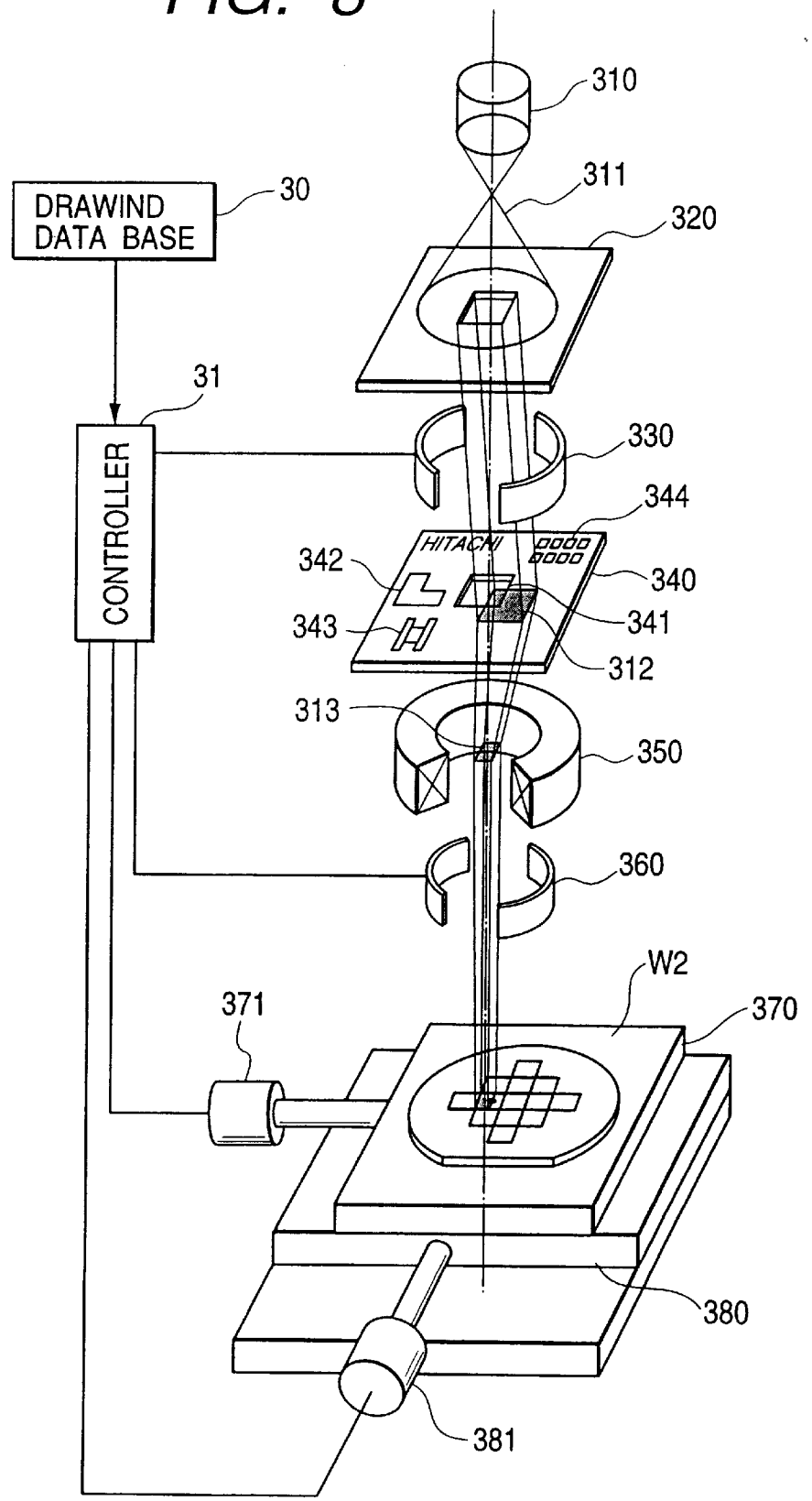
FIG. 8 is a perspective view indicating a schematic configuration of electron beam equipment used for drawing partial parts of each object particle at a time in an embodiment of the present invention.

FIG. 8 is a perspective view of electron beam exposure equipment. The electron beam 311 emitted from an electron gun 310 is focused in proper size and shape through the first mask 320, then applied on the second mask 340 through a deflector 330. When the pattern mask 300 for the cross section treatment of each particle is exposed to a light, the electron beam 311 is formed by a combination of the aperture 341 and the electron beam 312. On the other hand, the deflector 330 selects circuit patterns 342, 343, and 344 and the electron beam 312 is applied on each of those patterns. The electron beam formed by a hole 341 is then condensed by a condensing lens 350 and applied at a predetermined position of the photo-resisted wafer W2 by a positioning deflector 360.

The photo-resisted wafer W2 is mounted on the X stage 370 provided on the Y stage 380. The wafer W2 is then driven in the X and Y directions respectively by the X and Y direction drivers 371 and 372.

The controller 31 receives pattern data from the pattern data base 30 so as to control the selecting deflector 330, the positioning deflector 360, the X direction driver 371, and the Y direction driver 372, thereby applying the electron beam 313 in a predetermined region on the photo-resisted wafer W2.

Although the above exposing equipment uses an electron beam as a light-exposing source, the light exposing equipment may also use a laser or ion beam so that operations are switched between the cross section treatment of an object particle and patterning of a normal circuit using the above controlling method. In addition, a so-called spot scanning light-exposing equipment, which uses none of the first and second masks 320 and 340, can draw a pattern according to the pattern data from the pattern data base 30 in the same way by switching the patterning operation between cross section treatment of a particle and patterning of a normal circuit under the control of the controller 31.

The light-exposing equipment, which transfers a circuit pattern on a mask using a light or an X ray, can switch operations between cross section treatment of a particle and patterning of a normal circuit just like in the above case. For such a switching operation, the light-exposing equipment use s a function for selecting a light-exposing pattern on a mask by moving masks and stages and by opening/closing the masking blade that shields part of a mask for the object chip. In such a case, a proper circuit pattern on the mask is selected as a pattern for the cross section treatment of a particle, while other unnecessary patterns are shielded by the masking blade.

Instead of an optical light-exposing equipment, a liquid crystal pattern display equipment can be employed to creat masks for the above patterning operation. In this case, a drawing pattern is displayed on the liquid crystal pattern display screen according to the pattern data from the pattern data base 30 and an exposure light is inpinged onto this liquid crystal pattern display equipment, thereby the pattern is exposed on the surface of the resist-coated wafer. The use of such a liquid crystal pattern display equipment will thus make it easier to form a masking pattern corresponding to any pattern data from the pattern data base 30.

Since the cross section of each particle existing under a film can be treated without degrading the through-put of the semiconductor manufacturing processes and without polluting other normal chips using a semiconductor device manufacturing system provided with the inspecting equipment 21, the reviewing equipment 22, the electron beam exposing equipment 3, the particle server, etc. as shown in FIG. 1, it is possible to analyze each particle detected by the particle inspecting equipment effectively and flow each analyzed wafer to the next manufacturing process.

According to the present invention, the system configuration as described above will have the following effects:

(1) The cross section treatment of each particle is finished just when a normal circuit pattern is created. It is no need to add any other extra treatment step for such the cross section treatment in the object semiconductor device manufacturing process. In addition, since such the cross section treatment is done in an ordinary semiconductor device manufacturing process, other normal chips are never polluted during the treatment. It is thus possible to transfer each wafer on which particle elements are analyzed to the next process, thereby obtaining non-defective completed chips except for the object one to analyze.

(2) Since it is possible to remove particles generated in the preceding processes of semiconductor device manufacturing when an object particle to analyze is selected in a reviewing operation, the efficiency for selecting such a particle to analyze can be more improved. In addition, since accurate particle data is obtained, the above pattern data creating means can create highly accurate pattern data for the cross section treatment thereof.

(3) It is possible to create pattern data for each chip to analyze automatically from both coordinate data and size of each particle to analyze.

(4) It is possible to locate each particle and check analysis results efficiently in the analyzing means.

(5) It is possible to exclude each chip to analyze from those to be tested by the electric tester, thereby the position of the chip can be output onto a test result map, indicating that it is not subject to an OK/NG judgment.

What is claimed is:

1. A semiconductor device inspecting/analyzing system, comprising:

particle detecting means for detecting particles in a semiconductor wafer which is processed in a semiconductor device manufacturing line;

reviewing means for reviewing particles detected by said particle detecting means and measuring both position and size of each of said reviewed particles;

light-exposing means for exposing said semiconductor wafer coated with a photosensitive material thereon with a light pattern having a shape according to both position and size of said particle measured by said reviewing means so that an edge of said light pattern intersects said particle;

etching means for etching said semiconductor wafer on which a pattern of the photosensitive material is formed by exposure of said light pattern by said light-exposing means, thereby etching a portion of said particle and exposing a cross section of said particle;

analyzing means for analyzing the element of said particle whose cross section is exposed by said etching means; and data processing means for processing data exchanged with said particle detecting means, said reviewing means, said light-exposing means, and said analyzing means.

2. A semiconductor device inspecting/analyzing system in accordance with claim 1, wherein said reviewing means receives inspection data detected by said detecting means, then passed to said data processing means, thereby displaying a particle detected by said detecting means.

3. A semiconductor device inspecting/analyzing system in accordance with claim 1, wherein said light-exposing means creates predetermined pattern data so that an edge of said pattern data intersects said particle according to both position and size of said particle, measured by said reviewing means and passed to said data processing means, thereby exposing light on said semiconductor device according to said pattern data.

4. A semiconductor device inspecting/analyzing system in accordance with claim 1, wherein said light-exposing means is electron beam exposing equipment.

5. A semiconductor device inspecting/analyzing system in accordance with claim 1, wherein said data processing means further exchanges data with an electric tester.

6. A method for inspecting/analyzing semiconductor devices, comprising the steps of:

detecting a particle on a semiconductor wafer which is processed in a semiconductor device manufacturing line;

displaying a particle selected from among said detected particles on a screen;

measuring both position and size of said displayed particle;

exposing said semiconductor wafer coated with a photosensitive material thereon with a light pattern having a shape according to both position and size of said measured particle so that an edge of said light pattern intersects said particle;

etching said semiconductor wafer on which a pattern of the photosensitive material is formed by exposure of said light pattern, thereby etching a portion of said particle and exposing a cross section of said particle; and analyzing the element of said particle whose cross section is exposed.

7. A method for inspecting/analyzing semiconductor devices in accordance with claim 6, wherein a particle selected from among said detected particles so as to be displayed on said screen is a particle stuck on said semiconductor wafer after other particles are all removed in a predetermined process.

8. A method for inspecting/analyzing semiconductor devices in accordance with claim 6, wherein predetermined pattern data is created according to both position and size of said measured particle so that an edge of the predetermined pattern data intersects said particle, then a pattern according to said predetermined pattern data is exposed to a light on said semiconductor device.

9. A method for inspecting/analyzing semiconductor devices in accordance with claim 6, wherein an electron beam is used for said light-exposure.

10. A method for inspecting/analyzing semiconductor devices, comprising the steps of:

detecting particles in a semiconductor wafer which is processed in a semiconductor device manufacturing line;

etching a particle selected from among said detected particles and exposing a cross section of said selected particle;

analyzing the element of said selected particle whose cross section is exposed; and continuing processing of said semiconductor wafer on which the element of said particle is already analyzed in said semiconductor device manufacturing line.

* * * * *